(12) United States Patent
Hashio et al.

(10) Patent No.: US 8,917,085 B2
(45) Date of Patent: Dec. 23, 2014

(54) CURRENT SENSOR

(75) Inventors: Shinichi Hashio, Shimada (JP); Toshiro Mochizuki, Shimada (JP); Takeshi Ai, Shimada (JP); Yasuhiro Sugimori, Shimada (JP); Yasunori Kawaguchi, Shimada (JP)

(73) Assignee: Yazaki Corporation, Tokyo (JP)

( * ) Notice: Subject to any disclaimer, the term of this patent is extended or adjusted under 35 U.S.C. 154(b) by 583 days.

(21) Appl. No.: 12/746,211

(22) PCT Filed: Dec. 5, 2008

(86) PCT No.: PCT/JP2008/072583
§ 371 (c)(1),
(2), (4) Date: Aug. 31, 2010

(87) PCT Pub. No.: WO2009/072668
PCT Pub. Date: Jun. 11, 2009

(65) Prior Publication Data
US 2010/0315066 A1    Dec. 16, 2010

(30) Foreign Application Priority Data

Dec. 7, 2007    (JP) .............................. P2007-317053

(51) Int. Cl.
| | | |
|---|---|---|
| *G01R 1/04* | (2006.01) | |
| *G01R 1/00* | (2006.01) | |
| *G01R 1/20* | (2006.01) | |
| *G01R 15/18* | (2006.01) | |
| *H01R 13/46* | (2006.01) | |
| *G01R 15/20* | (2006.01) | |
| *G01R 1/067* | (2006.01) | |
| *G01R 31/00* | (2006.01) | |

(52) U.S. Cl.
CPC ............ *G01R 15/20* (2013.01); *G01R 1/06788* (2013.01); *G01R 31/006* (2013.01)

USPC .......... 324/156; 324/110; 324/126; 324/127; 174/59

(58) Field of Classification Search
CPC . G01R 1/04; G01R 31/31914; G01R 1/06788
USPC .............................................. 324/156; 174/59
See application file for complete search history.

(56) References Cited

U.S. PATENT DOCUMENTS

| | | | | |
|---|---|---|---|---|
| 863,224 A | * | 8/1907 | Sawin ........................... | 220/327 |
| 1,702,421 A | * | 2/1929 | Smith ............................. | 324/92 |

(Continued)

FOREIGN PATENT DOCUMENTS

| | | | | |
|---|---|---|---|---|
| CN | 1415969 A | * | 5/2003 | ............. G01R 15/00 |
| CN | 101034099 A | * | 9/2007 | ............. G01R 11/24 |

(Continued)

OTHER PUBLICATIONS

Machine Translation of CN 1415969 A.*

(Continued)

*Primary Examiner* — Jermele M Hollington
*Assistant Examiner* — Christopher McAndrew
(74) *Attorney, Agent, or Firm* — Sughrue Mion, PLLC (57) ABSTRACT

A current sensor for measuring a current supplied to a conductor includes a case which accommodates an electrical parts therein, and a cover attached to the case. A groove part is provided on an outer surface of at least one of the case and the cover to allow the conductor to pass through the groove part. When the cover is attached to the case, the conductor arranged on the groove part is sandwiched between the case and the cover. A width of the groove part becomes narrower toward an interior side thereof.

7 Claims, 12 Drawing Sheets

(56) References Cited

U.S. PATENT DOCUMENTS

| | | | | |
|---|---|---|---|---|
| 2,887,657 A * | 5/1959 | Lamb et al. | | 324/151 A |
| 2,901,705 A * | 8/1959 | Lamb | | 324/156 |
| 3,518,538 A * | 6/1970 | Pruss | | 324/169 |
| 3,674,916 A * | 7/1972 | Langella | | 174/169 |
| 3,984,798 A * | 10/1976 | Bussen | | 336/176 |
| 4,139,822 A * | 2/1979 | Urich et al. | | 324/219 |
| 4,283,677 A * | 8/1981 | Niwa | | 324/127 |
| 4,709,339 A * | 11/1987 | Fernandes | | 700/293 |
| 4,728,887 A * | 3/1988 | Davis | | 324/127 |
| 4,791,361 A * | 12/1988 | Beihoff et al. | | 324/126 |
| 4,806,855 A * | 2/1989 | Davis | | 324/127 |
| 4,808,917 A * | 2/1989 | Fernandes et al. | | 324/127 |
| 4,829,298 A * | 5/1989 | Fernandes | | 340/870.27 |
| 4,884,038 A * | 11/1989 | Miljanic | | 330/165 |
| 4,886,980 A * | 12/1989 | Fernandes et al. | | 307/64 |
| 4,901,007 A * | 2/1990 | Sworm | | 324/110 |
| 5,317,250 A * | 5/1994 | Warmerdam | | 324/127 |
| 5,343,184 A * | 8/1994 | Matsui et al. | | 336/92 |
| 5,426,360 A * | 6/1995 | Maraio et al. | | 324/126 |
| 5,610,512 A * | 3/1997 | Selcuk | | 324/127 |
| 5,644,551 A * | 7/1997 | Carmichael et al. | | 368/5 |
| 5,829,651 A * | 11/1998 | Luchka | | 224/267 |
| 6,064,192 A * | 5/2000 | Redmyer | | 324/127 |
| 6,456,060 B1 * | 9/2002 | Wiesemann | | 324/127 |
| 6,624,622 B2 * | 9/2003 | Noh | | 324/72.5 |
| 6,756,776 B2 * | 6/2004 | Perkinson et al. | | 324/127 |
| D534,120 S * | 12/2006 | Ricci et al. | | D13/110 |
| 7,158,012 B2 * | 1/2007 | Wiesman et al. | | 340/538.16 |
| 7,312,686 B2 * | 12/2007 | Bruno | | 336/229 |
| 7,557,563 B2 * | 7/2009 | Gunn et al. | | 324/127 |
| 7,719,257 B2 * | 5/2010 | Robarge et al. | | 324/117 R |
| 7,733,080 B1 * | 6/2010 | Liu | | 324/126 |
| 7,746,055 B2 * | 6/2010 | Bose et al. | | 324/117 H |
| 7,750,621 B1 * | 7/2010 | Liu | | 324/126 |
| 8,008,576 B2 * | 8/2011 | Fuzetti | | 174/59 |
| 8,159,211 B2 * | 4/2012 | Wang et al. | | 324/127 |
| 8,536,857 B2 * | 9/2013 | Nero, Jr. | | 324/119 |
| 2003/0080722 A1 | 5/2003 | Noh | | |
| 2003/0169031 A1 * | 9/2003 | Viola | | 324/156 |
| 2004/0047700 A1 | 3/2004 | Maeda | | |

FOREIGN PATENT DOCUMENTS

| | | | | |
|---|---|---|---|---|
| JP | 3-040573 | | 4/1991 | |
| JP | 5-20850 U | | 3/1993 | |
| JP | 05312832 A | * | 11/1993 | G01R 1/04 |
| JP | 2001-004672 A | | 1/2001 | |
| JP | 2001153895 A | | 6/2001 | |
| JP | 2003-94280 A | | 4/2003 | |
| JP | 2003121476 A | | 4/2003 | |
| JP | 2004117064 A | | 4/2004 | |
| JP | 2004170091 A | | 6/2004 | |
| JP | 2005037284 A | * | 2/2005 | G01R 1/22 |
| JP | 2006078316 A | | 3/2006 | |
| WO | WO 2008095415 A1 | * | 8/2008 | G01R 15/18 |

OTHER PUBLICATIONS

Machine Translation of CN 101034099 A.*
Machine Translation of JP 02004117064A.*
Machine Translation of JP 2001-153895.*
Office Action issued Aug. 7, 2012 by the Japanese Patent Office in counterpart Japanese Application No. 2007-317035.
International Search Report (PCT/IB/210) for PCT/JP2008/072583, dated Mar. 10, 2009.
Communication dated Apr. 26, 2012 issued by the State Intellectual Property Office in Corresponding Chinese Application No. 200880119024.1.

* cited by examiner

CURRENT SENSOR

TECHNICAL FIELD

The present invention relates to a current sensor attached to a conductor to measure a current supplied to the conductor.

BACKGROUND ART

As a current sensor attached to an electric wire to measure a current supplied to the electric wire, for instance, below-described current sensors have been hitherto known (for instance, see patent literatures 1 to 3).

The current sensor described in the patent literature 1 includes a case in which electrical parts are accommodated and a cover. The case is formed in a cylindrical shape with a bottom including a bottom wall of a doughnut form in a plan and peripheral walls standing from an inner edge and an outer edge of the bottom wall. The cover is attached to the case so as to cover an opening of the case therewith. In the cover, a tubular guide part is provided that is allowed to pass through the center part of the case and allows an electric wire to pass through an inner part thereof. The inside diameter of the tubular guide part is formed to be slightly larger than the outside diameter of the electric wire. The electric wire is allowed to pass through the tubular guide part without a backlash, so that the deterioration of a measurement accuracy of the current sensor due to the backlash of the electric wire can be prevented.

Further, the current sensor described in the patent literature 2 includes a case in which electrical parts are accommodated and a fastening unit. The case is formed in a box shape. In the case, a through hole is formed that allows an electric wire to pass through. The fastening unit fastens the electric wire allowed to pass through the through hole to the case, and includes, for instance, a fixed mount part protruding from the outer edge of the through hole to mount the electric wire on an upper surface thereof and a fastening band that fastens the electric wire mounted on the fixed mount part to the fixed mount part. Since the electric wire is allowed to pass through the through hole without a backlash by the fastening unit, the deterioration of a measurement accuracy of the current sensor due to the backlash of the electric wire can be prevented.

A clamp shaped current sensor described in the patent literature 3 includes a pair of sensor heads, one side flat plate shaped partition wall part provided in one sensor head and the other side U-shaped groove type partition wall part provided in the other sensor head. When the pair of the sensor heads are overlapped together, a clamp measurement window having an inside diameter substantially equal to an outside diameter of an electric wire is formed by the one side partition wall and the other side partition wall to allow the electric wire to pass through the clamp measurement window. Since the electric wire is allowed to pass through the clamp measurement window without a backlash, the deterioration of a measurement accuracy of the current sensor due to the backlash of the electric wire can be prevented.

[patent literature 1] JP-A-2003-121476
[patent literature 2] JP-A-2006-78316
[patent literature 3] JP-A2005-37284

However, in the current sensors described in the patent literatures 1 to 3, a problem arises that the current sensors hardly meet the electric wires having different outside diameters. That is, the inside diameter of the tubular guide part needs to be changed, the inside diameter of the through hole and the length of the fastening band need to be changed or the inside diameter of the clamp measurement window needs to be changed so as to meet the outside diameter of the electric wire.

Further, in the current sensors described in the patent literatures 1 and 2, after the current sensor is attached to the electric wire, are carried out works that a terminal fitting is attached to the terminal of the electric wire or the electric wire is arranged. However, during these works, a problem arises that the current sensor collides with a periphery to be failed or the current sensor interferes with the work to deteriorate the efficiency of the work. Further, when the current sensor is brought into a failure after the electric wire is arranged in a prescribed wiring passage, a problem arises that a great labor and time are necessary for replacing the current sensor by a new current sensor. As one of countermeasures for the above-described problems, a method is considered that the current sensor is attached to the electric wire after the terminal fitting is attached to the electric wire. However, when the terminal fitting is previously attached to the electric wire, since the terminal fitting needs to pass through the tubular guide part or the through hole, the inside diameter of the tubular guide part of the through hole is inconveniently enlarged to make the current sensor large.

It is an object of the present invention to solve the above-described problems. Namely, it is an object of the present invention to provide a current sensor that can be simply attached to electric wires having different outside diameters without a backlash.

DISCLOSURE OF THE INVENTION

In order to solve the above-described problems and achieve the above-described object, there is a provide a current sensor for measuring a current supplied to a conductor, comprising:

a case which accommodates an electrical parts therein; and a cover attached to the case, wherein a groove part is provided on an outer surface of at least one of the case and the cover to allow the conductor to pass through the groove part;

wherein when the cover is attached to the case, the conductor arranged on the groove part is sandwiched between the case and the cover; and wherein a width of the groove part becomes narrower toward an interior side thereof.

Preferably, the current sensor, further comprises a fixing member arranged between the case and the cover to hold the conductor which is arranged on the groove part.

Preferably, the cover is comprised of a material having a magnetic shield property.

Preferably, the cover is formed in an annular shape having a gap along an extending direction of the conductor.

Preferably, the current sensor further comprises a protruding part which protrudes from one of the case and the cover to the other. When the cover is attached to the case, the protruding part abuts on the other of the case and the cover.

Preferably, the current sensor further comprises a positioning portion which positions the case and the cover relatively.

According to the above configurations, the conductors having different outside diameters can be allowed to pass through or be arranged on the groove part without a backlash. After the conductor is allowed to pass through the groove part, the cover is attached to the case to sandwich the conductor between the case and the cover, so that the current sensor can be simply attached to the conductors having the different outside diameters without a backlash. Further, since the groove part is provided so that the width of the groove part becomes narrower toward the interior side, that is, becomes wider toward an opening side, the electric wire can be easily allowed to pass through the groove part.

According to the above configurations, since the current sensor includes the fixing member arranged between the case and the cover to hold the conductor which is arranged on the groove part, only the fixing member is replaced by another fixing member to meet the outside diameter of the conductor, so that the current sensor can be attached to the conductors having the different outside diameters and a cost can be suppressed.

According to the above configurations, since the cover is comprised of a material having a magnetic shield property, magnetic field noise from a periphery does not reach the case so that the current can be highly accurately measured.

According to the above configurations, since the cover is formed in an annular shape having a gap along an extending direction of the conductor, a magnetic flux generated from the conductor when the current is supplied to the conductor is combined with a magnetic flux generated in the gap by the magnetic flux to generate an area where the change of a magnetic flux density is flat between the conductor and the gap. Electrical parts are arranged in this area, so that even when the position of the electrical parts is varied, the current can be accurately measured and the cover can be prevented from being saturated with a small current.

According to the above configurations, since the current sensor includes a protruding part that protrudes from one of the case and the cover to the other, and abuts on the other when the cover is attached to the case, the backlash of the case and the cover can be assuredly prevented.

According to the above configurations, since the current sensor includes a positioning portion that positions the case and the cover relatively, the case and the cover can be simply positioned.

BEST MODE FOR CARRYING OUT THE INVENTION

Figure 1:
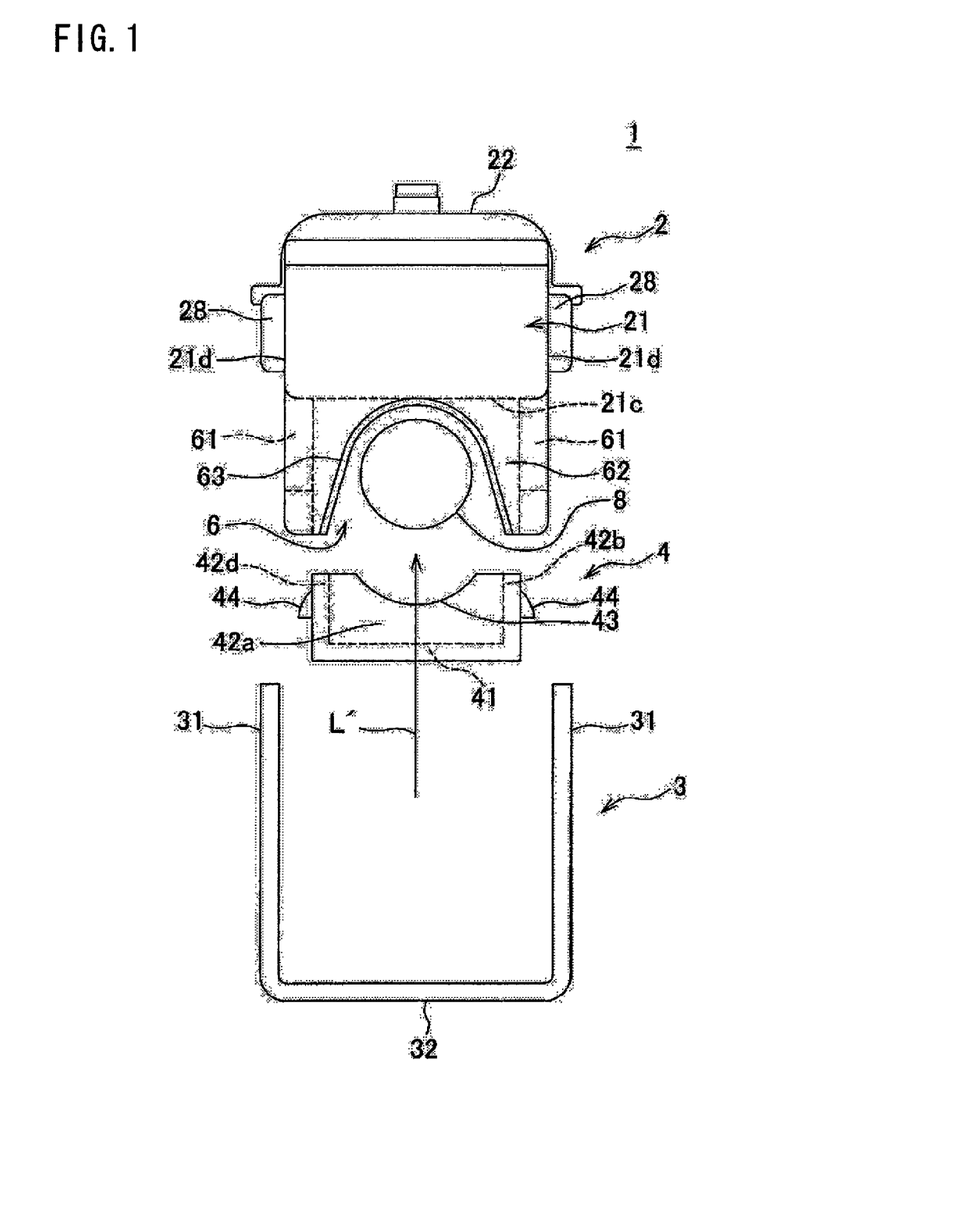
FIG. 1 is an exploded front view of a current sensor according to a first embodiment of the present invention.
Figure 2:
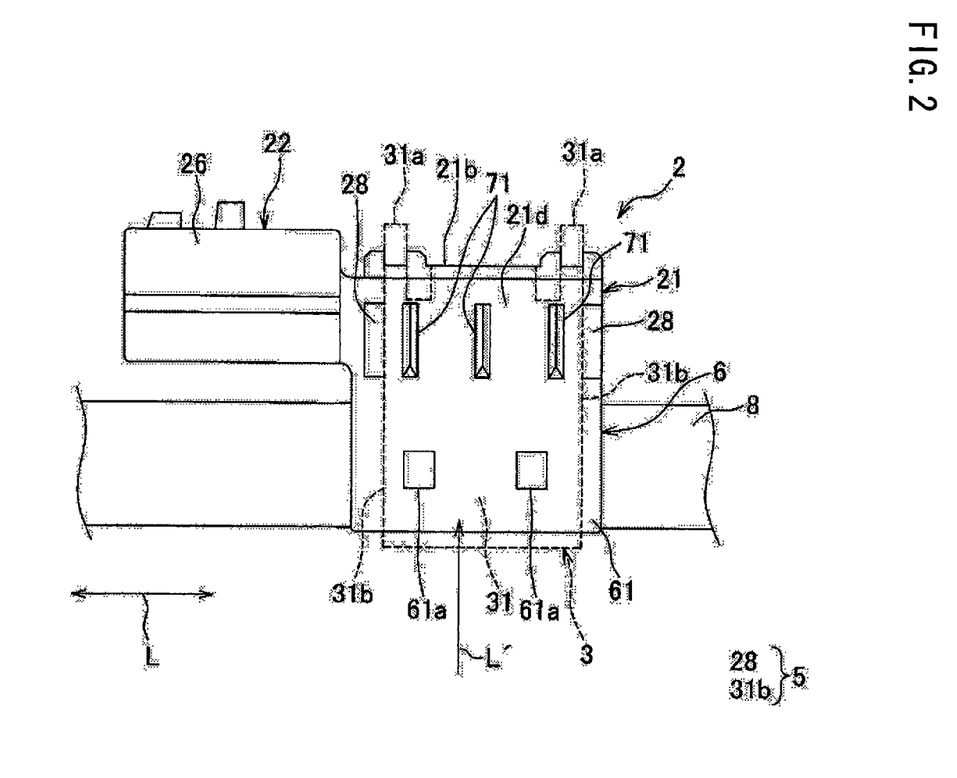
FIG. 2 is a side view showing a state that a case shown in FIG. 1 is attached to an electric wire.

A current sensor according to a first embodiment of the present invention will be described below by referring to FIGS. 1 to 7. The current sensor 1 is attached to an electric wire (a conductor) 8 as shown in FIG. 2 to measure a current supplied to the electric wire 8. The current sensor 1 includes, as shown in FIG. 1, a case 2, a cover 3, a fixing member 4 and a positioning portion 5 (FIG. 2).

For example, the electric wire 8 forms a wire harness arranged in a motor vehicle as a mobile body. The electric wire 8 includes an electrically conductive core wire and an insulating coating part. The core wire is formed by twisting a plurality of element wires. The element wire forming the core wire is made of an electrically conductive metal material. Further, the core wire may be formed with one element wire. The coating part is made of, for instance, a synthetic resin such as polyvinyl chloride. The core wire is coated with the coating part. The core wire and the coating part with which the core wire is coated form the electric wire 8 whose sectional form is circular.

Figure 3:
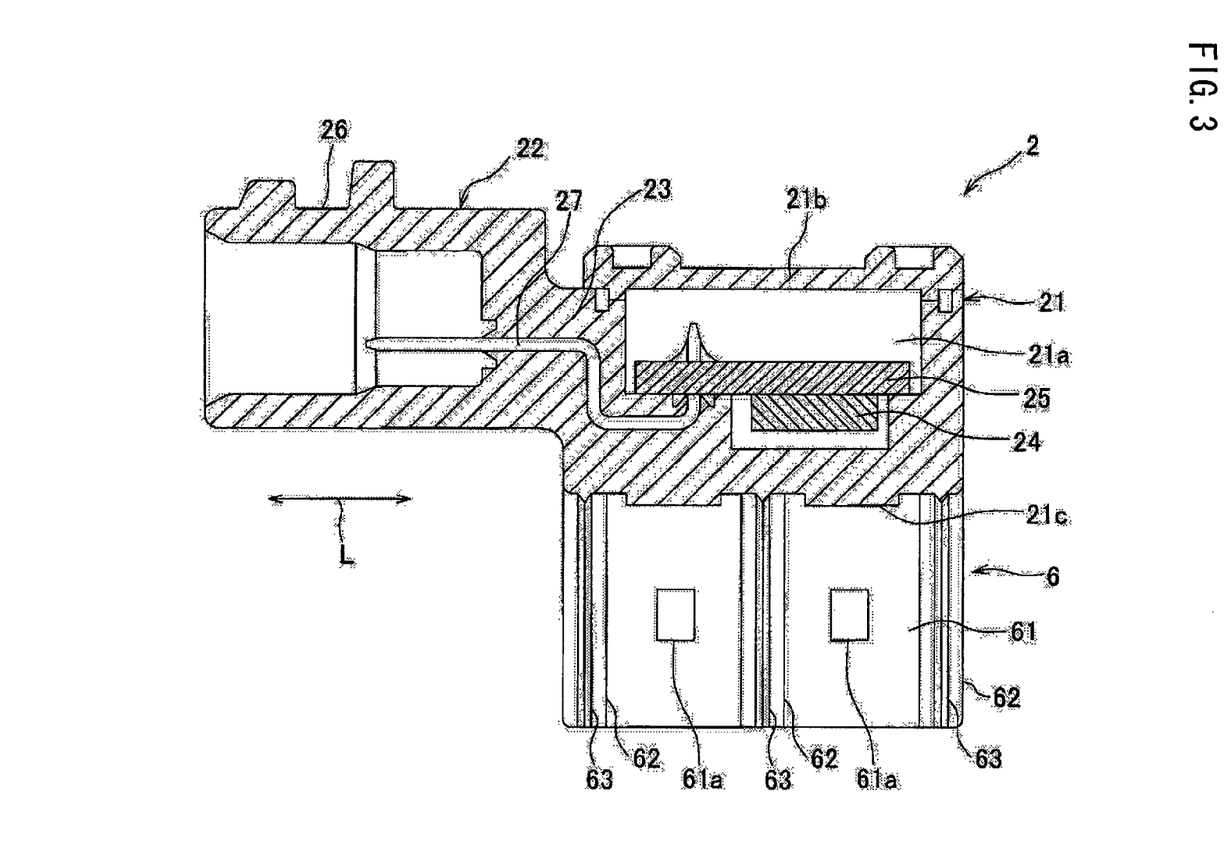
FIG. 3 is a sectional view of the case shown in FIG. 2.
Figure 4:
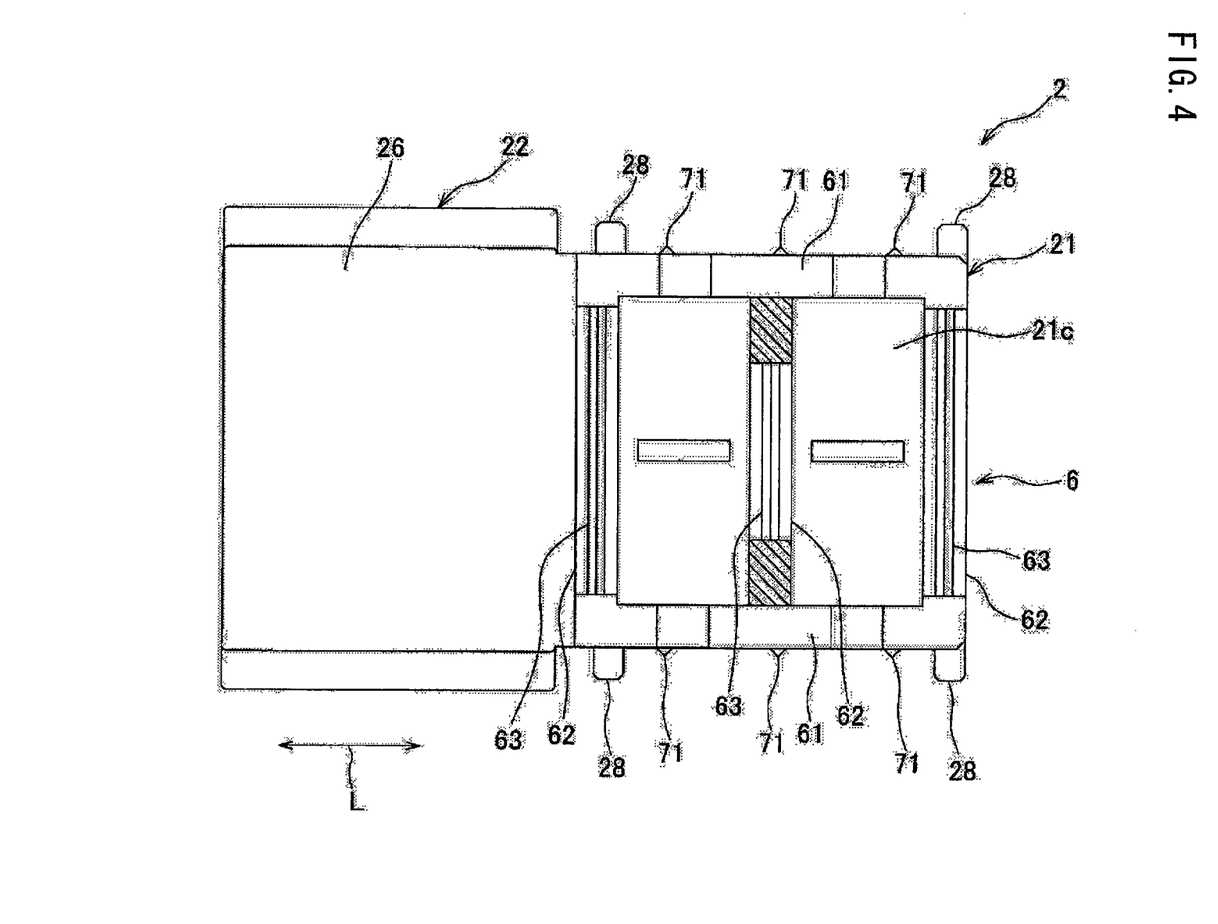
FIG. 4 is a bottom view of the case shown in FIG. 2.

The case 2 is made of an insulating synthetic resin. As shown in FIGS. 2 to 4, the case 2 includes a case main body 21 and a connector part 22 formed integrally therewith. In the case main body 21, an element accommodating part 21a formed in a recessed shape from an outer surface thereof and a cover part 21b for covering the element accommodating part 21a are provided as shown in FIG. 3. In the element accommodating part 21a, a magneto-electric conversion element (electrical parts) 24 or a wiring board 25 is accommodated.

The magneto-electric conversion element 24 is formed, for instance, with a Hall element that detects a magnetic flux density of a magnetic field generated when the current is supplied to the electric wire 8, converts the magnetic field to an electric signal corresponding to the level of the magnetic flux density and outputs the electric signal. The wiring board 25 is arranged along the longitudinal direction L of the electric wire to which the current sensor 1 is attached. On an outer surface of the wiring board 25 near the electric wire 8, the magneto-electric conversion element 24 is mounted.

The connector part 22 is provided in parallel with the case main body 21 along the longitudinal direction L of the electric wire. The connector part 22 includes, as shown in FIG. 3, a connector housing 26 and a terminal fitting 27 protruding to the connector housing 26. The connector housing 26 has one end connected to the outer surface of the case main body 21 and the other end formed in a cylindrical shape having an opened bottom.

The terminal fitting 27 is formed by bending an electrically conductive metal material. A central part of the terminal fitting 27 in the longitudinal direction is accommodated in a connecting part 23 of the case main body 21 and the connector part 22. One end of the terminal fitting 27 protrudes to the element accommodating part 21a of the case main body 21 and is electrically connected to the wiring board 25. The other end of the terminal fitting 27 is electrically connected to a terminal fitting of a mated connector (not shown in the drawing).

To the connector part 22 having the above-described structure, the mated connector is fitted. The connector part 22 is fitted to the mated connector so that a power is supplied to the magneto-electric conversion element 24 and the electric signal is outputted from the magneto-electric conversion element 24.

Further, in the case 2, a groove part 6 and protruding parts 71 are provided. The groove part 6 is provided on the outer surface of the case 2 as shown in FIGS. 3 and 4. The groove part 6 is provided along the longitudinal direction L of the electric wire to allow the electric wire 8 to pass through. The groove part 6 includes a pair of side walls 61 standing from a bottom surface 21c of the case main body 21, a plurality of standing walls 62 for connecting both ends and central parts of the pair of side walls 61 together and cut out parts 63 provided respectively in the standing walls 62.

The pair of side walls 61 are provided along the longitudinal direction L of the electric wire. The outer surfaces of the pair of the side walls 61 are respectively provided to be flush with side walls 21*d* of the case main body 21. The pair of the side walls 61 are provided in parallel with each other. On the pair of the side walls 61 respectively, a plurality of lock holes 61*a* passing through the side walls 61 are provided.

Three standing walls 62 are provided in an illustrated example (FIG. 4). The three standing walls 62 are respectively provided so as to intersect at right angles to the longitudinal direction L of the electric wire. The three standing walls 62 are arranged in parallel at equal intervals along the longitudinal direction L of the electric wire.

The cut out part 63 is formed so as to cut out the standing wall 62 from the end of the standing wall 62 toward a part near the case main body 21 as shown in FIG. 1. The cut out part 63 cuts out the standing wall 62 substantially in a shape of V so that a width becomes narrower as the cut out part 63 comes nearer to the case main body 21. When the electric wire 8 is allowed to pass through the groove part 6, the electric wire 8 comes into contact with parts of the cut out parts 63 respectively. Further, on the surfaces (edge parts) of the cut out parts 63, protruding parts of substantially V shaped sections protrude inward the cut out parts 63. When the electric wire 8 is held, the protruding parts bite the coating part of the electric wire 8 so that the displacement of the current sensor 1 relative to the electric wire 8 is prevented.

The protruding parts 71 are provided so as to protrude from the side walls 21*d* of the case main body 21 as shown in FIG. 2. The protruding parts 71 are provided so as to protrude from the case 2 to the cover 3. The protruding parts 71 are provided in the forms of ribs along a direction L' intersecting at right angles to the longitudinal direction L of the electric wire. A plurality of protruding parts 71 are provided. The plurality of protruding parts 71 are arranged in parallel with each other at prescribed intervals along the longitudinal direction L of the electric wire. When the cover 3 is attached to the case 2, ends of the protruding parts 71 abut on inner surfaces of a below-described pair of walls 31 of the cover 3 to prevent relatively the backlash of the case 2 and the cover 3.

Figure 5:
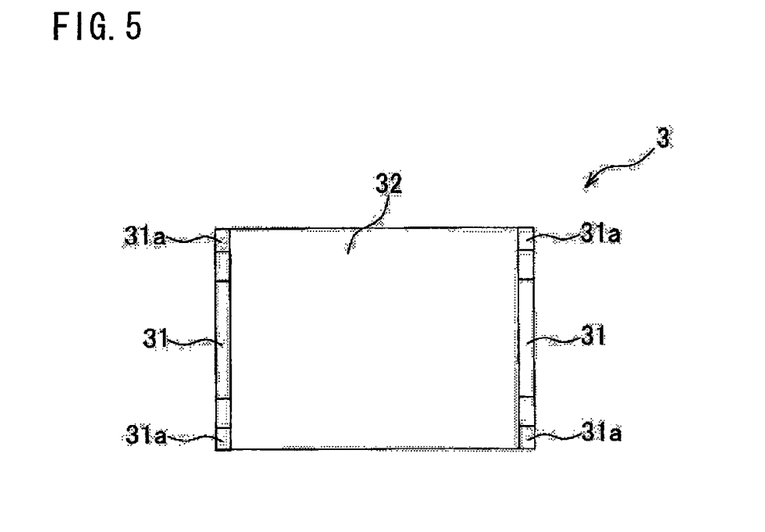
FIG. 5 is a top view of a cover shown in FIG. 1.
Figure 6:
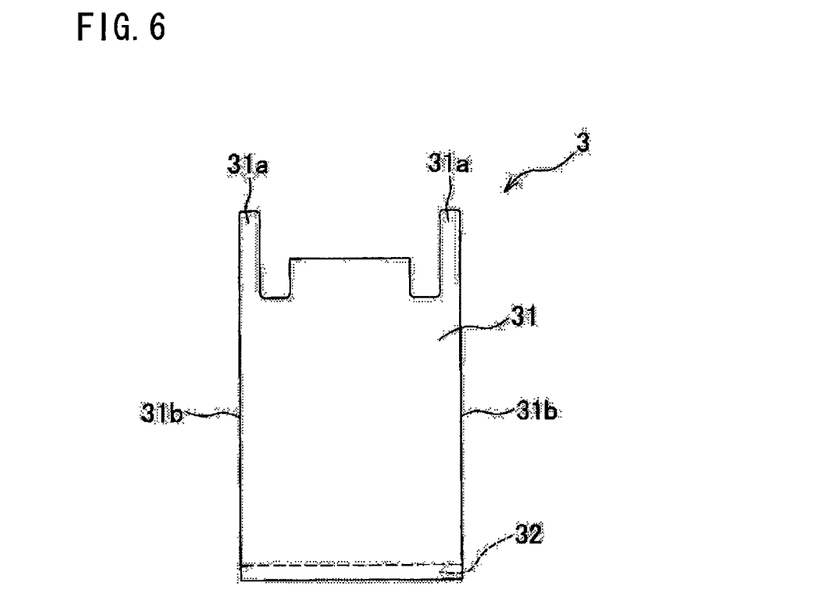
FIG. 6 is a side view of the cover shown in FIG. 1.

The cover 3 is made of a metal material having a high permeability such as permalloy and has a magnetic shied property. As shown in FIGS. 5 and 6, the cover 3 includes a pair of walls 31 and a connecting wall 32 for connecting one end parts of the pair of the walls 31 respectively and is formed in a U shape. The pair of the walls 31 and the connecting wall 32 are respectively formed in the shapes of belt plates and arranged so as to intersect at right angles to each other. The pair of the walls 31 are opposed to each other with a space between them and arranged in parallel with each other. The space between the pair of the walls 31 is formed so as to be slightly larger than the width (a transverse direction in FIG. 1) of the case 2.

At the ends of the pair of the walls 31 respectively, bending pieces 31*a* are provided. The bending pieces 31*a* respectively protrude along the longitudinal direction of the walls 31 from both ends in the directions of the width of the walls 31. After the cover 3 is attached to the case 2, the bending pieces 31*a* are bent so as to extend along the outer surface of the case 2 to prevent the cover 3 from slipping out from the case 2.

The cover 3 having the above-described structure is attached to the case 2 along the direction L' intersecting at right angles to the cover 2 to which the fixing member 4 is attached. When the cover 3 is attached to the case 2, magnetic field noise from an external part passes through the cover 3 so that the magnetic field noise does not reach the case 2. Accordingly, the magneto-electric conversion element 24 can accurately detect the magnetic flux density of the magnetic field generated when the current is supplied to the electric wire 8 to measure the current with good accuracy.

Figure 7:
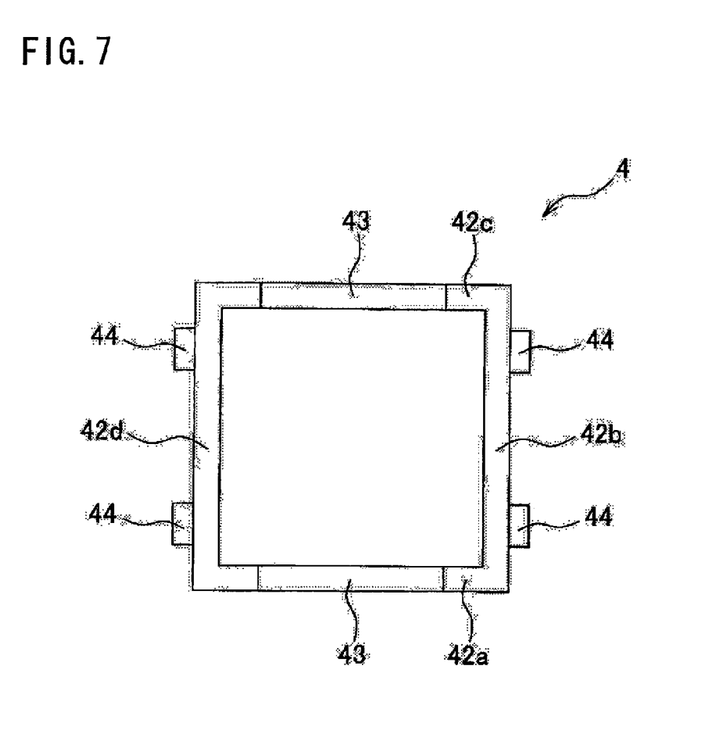
FIG. 7 is a top view of a fixing member shown in FIG. 1.

The fixing member 4 includes, as shown in FIGS. 1 and 7, a rectangular bottom wall 41, and peripheral walls 42*a*, 42*b*, 42*c* and 42*d* standing from outer edges of the bottom wall 41, and is formed in the shape of a box having an opening. In the peripheral walls 42*a*, 42*b*, 42*c* and 42, cut out parts 43 and lock protrusions 44 are provided.

The cut out parts 43 are formed on the peripheral walls 42*a* and 42*c* opposed to each other. The cut out parts 43 are formed by cutting out the peripheral walls 42*a* and 42*c* from the ends of the peripheral walls 42*a* and 42*c* toward the bottom wall 41. The cut out parts 43 are formed by cutting out the peripheral walls 42*a* and 42*c* in protruding circular arc shapes toward the bottom wall 41.

The lock protrusions 44 are provided on the outer surfaces of the peripheral walls 42*b* and 42*d* intersecting at right angles to the peripheral walls 42*a* and 42*c* and protrude outward the fixing member 4 from the outer surfaces. When the fixing member 4 is attached to the case 2, the lock protrusions 44 are engaged with the lock holes 61*a* of the case 2 to prevent the fixing member 4 from slipping out from the case 2.

The fixing member 4 having the above-described structure is attached to the case 2 along the direction L' intersecting at right angles to the longitudinal direction L of the electric wire after the electric wire 8 is allowed to pass through the groove part 6, the electric wire 8 is sandwiched between the cut out parts 43 and the cut out parts 63 of the groove part 6 to hold the electric wire 8 between the case 2 and the fixing member 4. The height of the peripheral walls 42*a* and 42*c* or the forms of the cut out parts 43 are suitably changed so that the electric wires 8 having different outside diameters can be held between the case 2 and the fixing member 4.

The positioning portion 5 includes, as shown in FIG. 2, outer edges 31*b* in the direction of width of the walls 31 of the cover 3 and a plurality of ribs 28 provided in the case 2. The ribs 28 are provided to protrude from both the side surfaces 21*d* of the case main body 21 and formed along the direction L' intersecting at right angles to the longitudinal direction L of the electric wire. Pairs of ribs 28 (four in total) are provided respectively on the side surfaces 21*d* of the case main body 21 and arranged so that the protruding parts 71 are located between the pairs of the ribs 28. The pair of the ribs 28 are provided in parallel with each other with a space between them. A space between the pair of the ribs 28 is provided so as to be a little wider than the width between the pair of the walls 31. The positioning portion 5 having the above-described structure positions the walls 31 between the pairs of the ribs 28 to position the case 2 relatively to the cover 3.

When the current sensor 1 having the above-described structure is attached to the electric wire 8, the electric wire 8 is initially allowed to pass through the groove part 6 of the case 2, and then, the fixing member 4 is attached to the case 2 along the direction L' intersecting at right angles to the longitudinal direction of the electric wire so as to hold the electric wire 8 between the case 2 and the fixing member 4. Subsequently, the cover 3 is allowed to come nearer to the case 2 along the direction L' intersecting at right angles to the longitudinal direction L so that the case 2 is located between the pair of the walls 3 of the cover 3. Then, after the inner surfaces of the cover 3 are allowed to come into contact with the side surfaces 21*d* of the case main body 21, the pair of the walls 61 of the groove part 6 or the bottom wall 41 of the fixing member 4, the bending pieces 31*a* of the cover 3 are bent to attach the cover 3 to the case 2. After the current sensor 1 is attached to the electric wire 8 as described above, the current supplied to the electric wire 8 is measured.

According to this embodiment, the current sensor 1 includes the case 2 in which the magneto-electric conversion element 24 is accommodated, the cover 3 attached to the case 2 and the groove part 6 provided on the outer surface of the case 2 to allow the electric wire 8 to pass through. When the cover 3 is attached to the case 2, the electric wire 8 allowed to pass through the groove part 6 is sandwiched between the case 2 and the cover 3. The groove part 6 is formed so that the width of the groove part 6 becomes narrower toward the interior side thereof (toward the direction L' in FIG. 1). Accordingly, the electric wires 8 having the different outside diameters can be allowed to pass through the groove part 6 without a backlash. After the electric wire 8 is allowed to pass through the groove part 6, the cover 3 is attached to the case 2 to sandwich the electric wire 8 between the case 2 and the cover 3, so that the current sensor 1 can be simply attached to the electric wires 8 having the different outside diameters without the backlash. Further, since the groove part 6 is provided so that the width of the groove part 6 becomes narrower toward the interior side, that is, the width of the groove part 6 becomes wider toward an opening side, the electric wire 8 can be easily allowed to pass through the groove part 6.

Since the current sensor includes the fixing member 4 arranged between the case 2 and the cover 3 to hold the electric wire 8 allowed to pass through groove part 6 between the case 2 and the fixing member 4. Accordingly, only the fixing member 4 is replaced by another fixing member to meet the outside diameter of the electric wire 8, so that the current sensor 1 can be attached to the electric wires 8 having the different outside diameters and a cost can be suppressed.

Since the cover 3 is formed with a material having a magnetic shield property, the magnetic field noise from the periphery does not reach the case 2 so that the current can be highly accurately measured.

Since the current sensor includes the protruding parts 71 that protrude from the case 2 to the cover 3 and abut on the cover 3 when the cover 3 is attached to the case 2, the backlash of the case 2 and the cover 3 can be assuredly prevented.

Since the current sensor includes the positioning portion 5 that positions the case 2 and the cover 3 relatively, the case 2 and the cover 3 can be simply positioned.

Now, a current sensor 101 according to a second embodiment of the present invention will be described below by referring to FIGS. 8 to 11. The same components as those of the above-described first embodiment are designated by the same reference numerals and an explanation thereof will be omitted.

Figure 8:
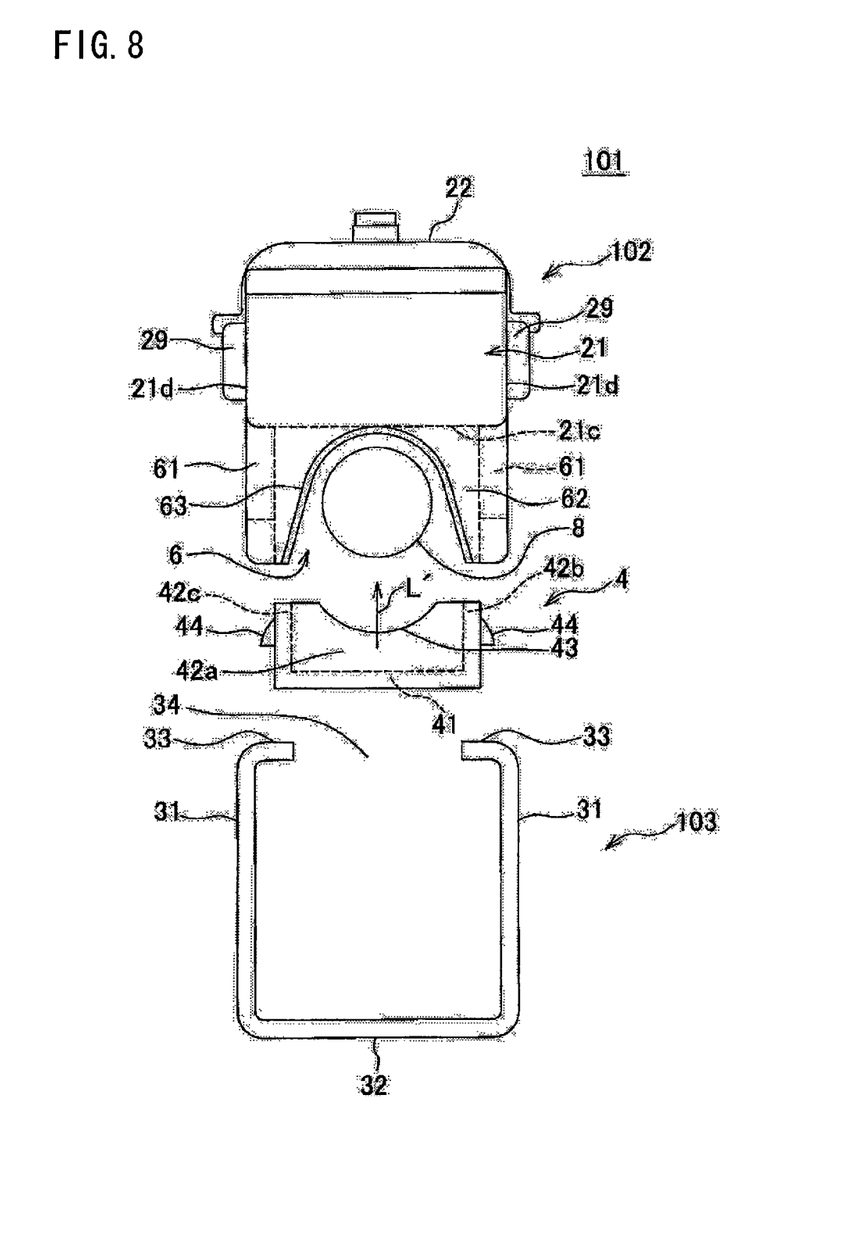
FIG. 8 is an exploded front view of a current sensor according to a second embodiment of the present invention.

The current sensor 101 according to the second embodiment of the present invention includes, as shown in FIG. 8, a cover 103, a case 102, a positioning portion 105 (FIG. 9) and a fixing member 4. In the current sensor 101, the cover 103, the case 102 and the positioning portion 105 are different from those of the first embodiment.

The cover 103 includes, as shown in FIG. 8, a pair of walls 31, a connecting wall 32 for connecting together one end parts of the pair of the walls 31 respectively and a pair of protruding walls 33 extending respectively from the ends of the pair of the walls 31 so as to allow the ends of the walls 31 to come near to each other. Between the pair of the protruding walls 33, a gap (space) 34 is formed. When the cover 103 is attached to the case 102, the gap 34 is arranged in parallel with a direction in which a current is supplied (a longitudinal direction L of an electric wire). That is, the cover 103 is formed in an annular shape having the gap 34 along the direction in which the current is supplied. Further, the inside diameter of the cover 103 is formed so as to be a little larger than the outside diameter of the case 102.

Figure 10:
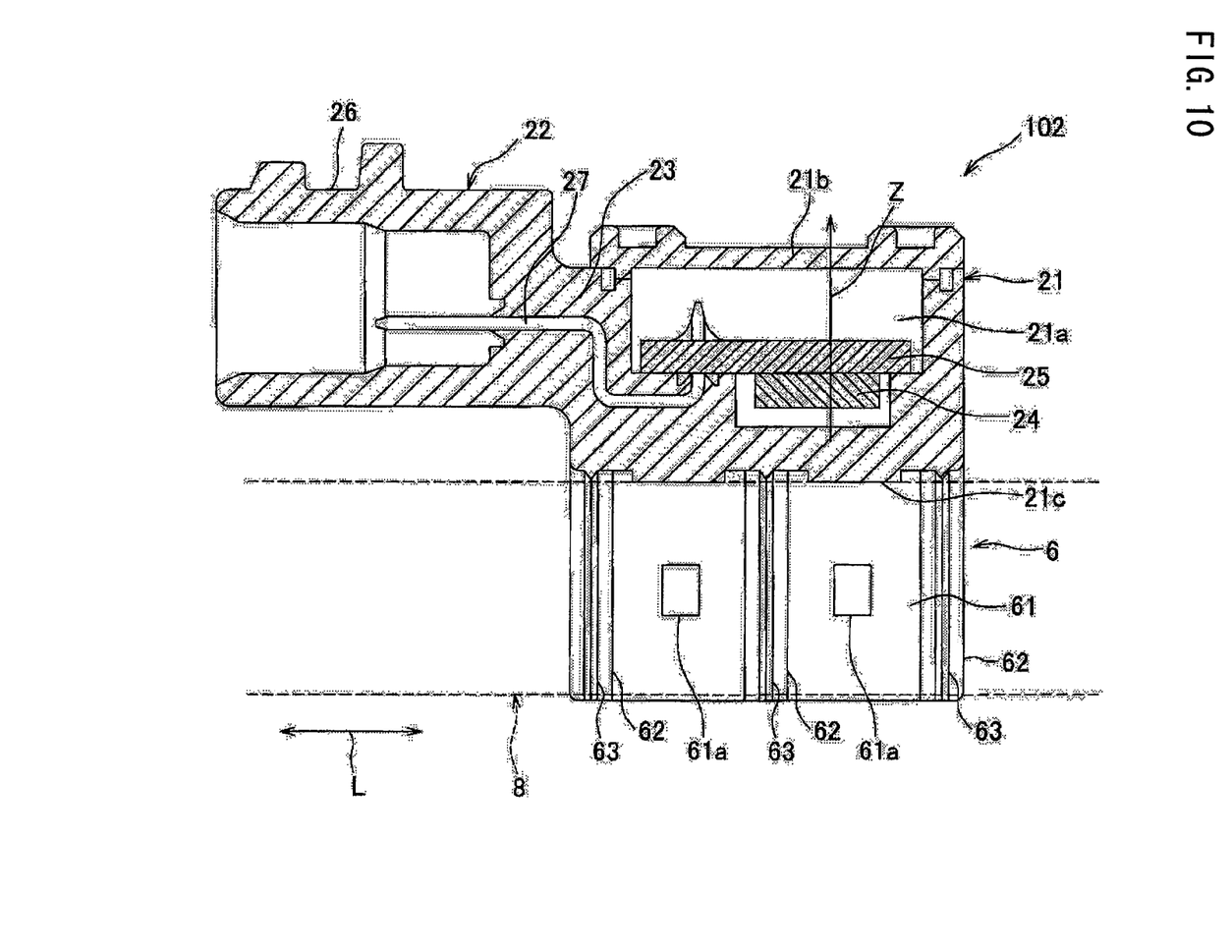
FIG. 10 is a sectional view of the case shown in FIG. 9.
Figure 11:
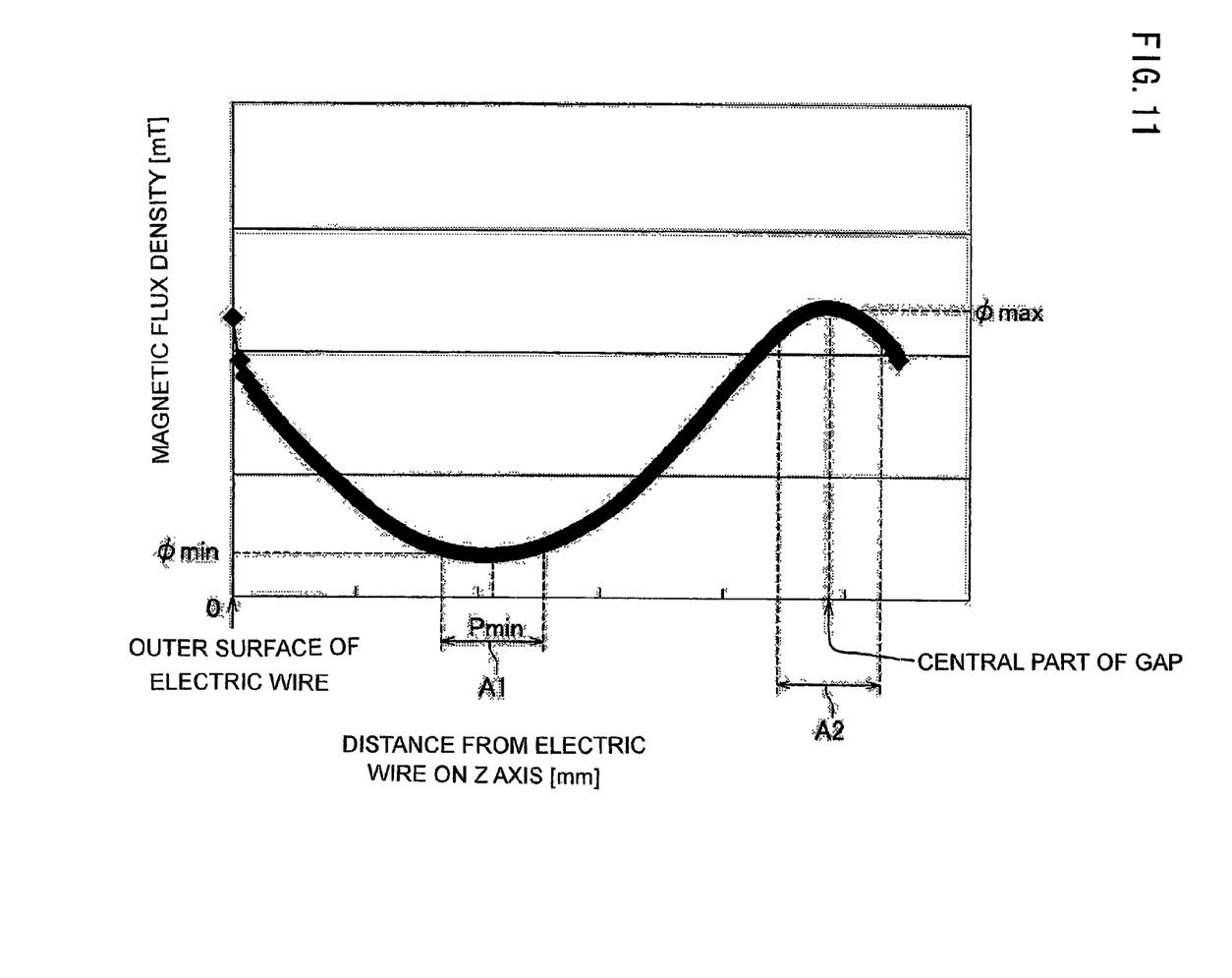
FIG. 11 is a graph showing a relation between a distance from the electric wire and a magnetic flux density on an axis that passes through the center of a gap and intersects at right angles to the electric wire.

The inventor et al. of the present invention used the cover 103 having the above-described structure to measure a magnetic flux density on a Z axis when the current of 100 A is supplied to an electric wire 8 and examined the relation between a distance from the outer surface of the electric wire 8 and the magnetic flux density on the Z axis. The Z axis is defined as an axis that passes through the center of the gap 34 and intersects at right angles to the electric wire 8 (FIG. 10). An obtained result is shown in FIG. 11. As shown in FIG. 11, as the distance from the outer surface of the electric wire 8 is larger, the magnetic flux density of a magnetic filed from the electric wire 8 is more decreased to become minimum φmin. After that, as the distance from the outer surface of the electric wire 8 is smaller to come nearer to the gap 34, the magnetic flux density is more increased due to an influence of a leakage magnetic flux from the cover 103 to become maximum φmax at the central part of the gap 34.

Since a magnetic flux in the gap 34 of the cover 103 is combined with a magnetic flux of the electric wire 8 in an area A1 in the vicinity of a position Pmin where the minimum value φmin of the magnetic flux density is obtained, the change of the magnetic flux in the area A1 is flatter than that in an area A2 of the gap 34. Namely, it was understood that the change of the magnetic flux depending on the variation of an arranged position was smaller in the area A1 than that in the area A2.

When a magneto-electric conversion element 24 is arranged in the above-described position Pmin, the magneto-electric conversion element 24 can be arranged within the area A1 where even when the arranged position of the magneto-electric conversion element 24 is slightly varied, the change of the magnetic flux is flat. Then, for instance, even when the case 102 holding the magneto-electric conversion element 24 expands or contracts owing to the change of ambient temperature to vary the arranged position of the magneto-electric conversion element 24, since the change of the magnetic flux is small as described above, the output of the magneto-electric conversion element 24 is hardly varied. Thus, the current can be accurately measured. Further, such a cover 103 is used so that the cover 103 can be prevented from being magnetically saturated with a small current. The position Pmin where the magnetic flux becomes the minimum value φmin is different for each of products.

Figure 9:
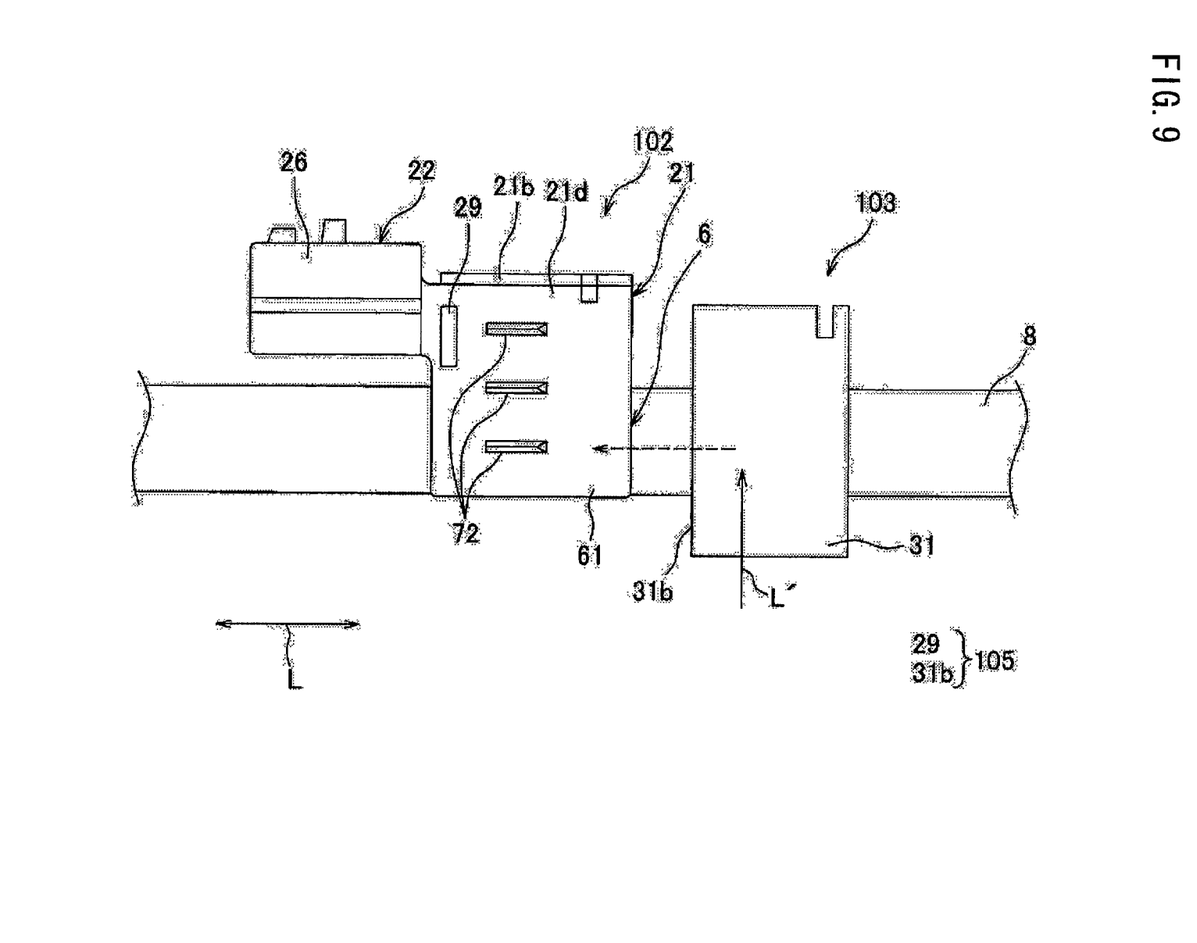
FIG. 9 is a side view showing a state that a case and a cover shown in FIG. 8 are attached to an electric wire.

In the case 102, protruding parts 72 are provided as shown in FIG. 9. The protruding parts 72 are provided so as to protrude on the side surfaces 21d of a case main body 21 and from outer surfaces of a pair of side walls 61 of a groove part 6.

The protruding parts 72 are provided in the shapes of ribs along the longitudinal direction L of the electric wire. A plurality of ribs 72 are provided. The plurality of the protruding parts 72 are arranged in parallel at prescribed intervals along a direction L' intersecting at right angles to the longitudinal direction L of the electric wire. The protruding parts 72 are provided so as to protrude from the case 102 to the cover 103. When the cover 103 is attached to the case 102, ends of the protruding parts 72 abut on inner surfaces of a below-described pair of walls 31 of the cover 103 to prevent relatively the backlash of the case 102 and the cover 103.

The positioning portion 5 includes, as shown in FIG. 9, outer edges 31b in the direction of width of the pair of the walls 31 of the cover 103 and a plurality of ribs 29 provided in the case 102. The ribs 29 are provided to protrude from both the side surfaces 21d of the case main body 21 and formed along the direction L' intersecting at right angles to the longitudinal direction L of the electric wire. One ribs 29 (two in total) are provided respectively on the side surfaces 21d of the case main body 21. The ribs 29 are arranged near a connector part 22 of the side surfaces 21d.

In the positioning portion 105 having the above-described structure, when the cover 103 is pressed to the case 102 so that the case main body 21 is allowed to pass through the cover 103 along the longitudinal direction L of the electric wire as described below, the outer edges 31b of the walls 31 abut on the ribs 29 so that the case 102 and the cover 103 are relatively positioned.

When the current sensor 101 having the above-described structure is attached to the electric wire 8, the electric wire 8 is initially allowed to pass through the groove part 6 of the case 102, and then, the fixing member 4 is attached to the case 102 along the direction L' intersecting at right angles to the longitudinal direction L of the electric wire so as to hold the electric wire 8 between the case 102 and the fixing member 4.

Subsequently, the cover 103 is attached to the case main body 21. At this time, the cover 103 is initially allowed to come nearer to the electric wire 8 protruding from the case main body 21 side to locate the electric wire 8 in the cover 103 through the gap 34 of the cover 103 (FIG. 9).

After that, the cover 103 is allowed to come nearer to the case 102 along the longitudinal direction L of the electric wire (shown by an arrow mark of a dotted line in FIG. 9) and pressed to the case 102 so that the case main body 21 is allowed to pass through the cover 103. Then, the cover 103 is pressed to the case 102 until the outer edges 31b of the pair of the walls 31 abut on the ribs 29. Then, the inner surfaces of the cover 103 are allowed to come into contact with a cover part 21b or the side surfaces 21d of the case main body 21, the pair of the walls 61 of the groove part 6 or the bottom wall 41 of the fixing member 4 to attach the cover 103 to the case 102. After the current sensor 101 is attached to the electric wire 8 as described above, the current supplied to the electric wire 8 is measured.

According to this embodiment, the current sensor 101 includes the case 102 in which the magneto-electric conversion element 24 is accommodated, the cover 103 attached to the case 102 and the groove part 6 provided on the outer surface of the case 102 to allow the electric wire 8 to pass through. When the cover 103 is attached to the case 102, the electric wire 8 allowed to pass through the groove part 6 is sandwiched between the case 102 and the cover 103. The groove part 6 is formed so that the width of the groove part 6 becomes narrower toward the interior side thereof. Accordingly, the electric wires 8 having different outside diameters can be allowed to pass through the groove part 6 without a backlash. After the electric wire 8 is allowed to pass through the groove part 6, the cover 103 is attached to the case 102 to sandwich the electric wire 8 between the case 102 and the cover 103, so that the current sensor 101 can be simply attached to the electric wires 8 having the different outside diameters without the backlash. Further, since the groove part 6 is provided so that the width of the groove part 6 becomes narrower toward the interior side, that is, the width of the groove part 6 becomes wider toward an opening side, the electric wire 8 can be easily allowed to pass through the groove part 6.

Since the cover 103 is formed in an annular shape having a gap along the direction in which the current is supplied, a magnetic flux generated from the electric wire 8 when the current is supplied to the electric wire 8 is combined with a magnetic flux generated in the gap 34 by the magnetic flux to generate an area where the change of a magnetic flux density is flat between the electric wire 8 and the gap 34. The magneto-electric conversion element 24 is arranged in this area, so that even when the position of the magneto-electric conversion element 24 is varied, the current can be accurately measured and the cover 103 can be prevented from being saturated with a small current.

Since the current sensor 101 includes the fixing member 4 arranged between the case 102 and the cover 103 to hold the electric wire 8 allowed to pass through groove part 6 between the case 102 and the fixing member 4. Accordingly, only the fixing member 4 is replaced by another fixing member to meet the outside diameter of the electric wire 8, so that the current sensor 101 can be attached to the electric wires 8 having the different outside diameters and a cost can be suppressed.

Since the cover 103 is formed with a material having a magnetic shield property, magnetic field noise from a periphery does not reach the case 102 so that the current can be highly accurately measured.

Since the current sensor includes the protruding parts 72 that protrude from the case 102 to the cover 103 and abut on the cover 103 when the cover 103 is attached to the case 102, the backlash of the case 102 and the cover 103 can be assuredly prevented.

Since the current sensor includes the positioning portion 105 that positions the case 102 and the cover 103 relatively, the case 102 and the cover 103 can be simply positioned.

Now, a current sensor 1 according to a third embodiment of the present invention will be described below by referring to FIG. 12. The same components as those of the above-described first and second embodiments are designated by the same reference numerals and an explanation thereof will be omitted.

Figure 12:
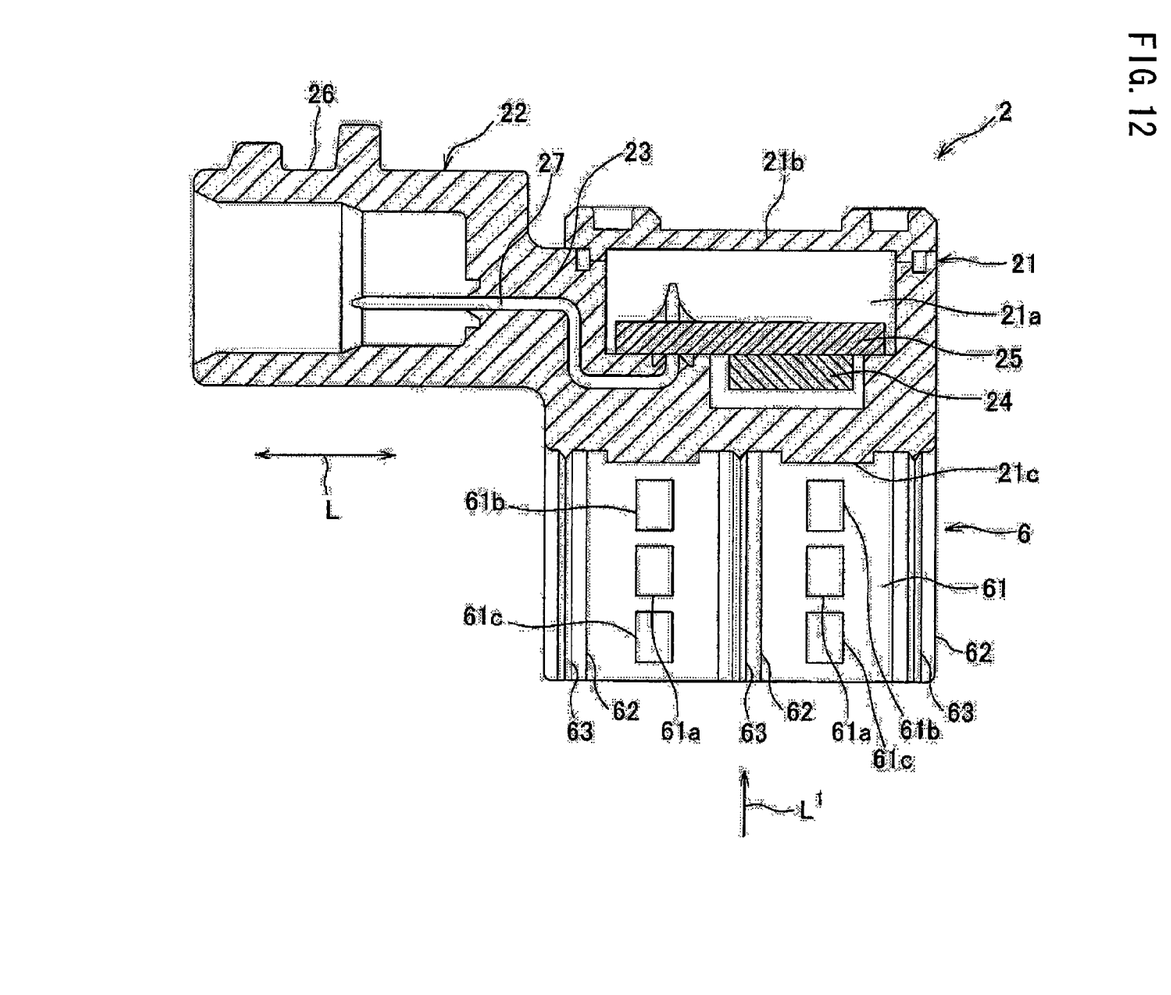
FIG. 12 is a sectional view showing a case of a current sensor according to a third embodiment of the present invention.

The current sensor 1 according to the third embodiment of the present invention include lock holes 61b and 61c in addition to lock holes 61a in the current sensor 1 of the first embodiment as described in FIG. 12.

The lock holes 61a, 61b and 61c respectively pass through a pair of side walls 61 and have a pair of holes along the longitudinal direction L of an electric wire. Further, the three pairs of the lock holes 61a, 61b and 61c are provided along a direction L' intersecting at right angles to the longitudinal direction L of the electric wire.

Since lock protrusions 44 of a fixing member 4 are engaged with any of the lock holes 61a, 61b and 61c having the above-described structure so that the fixing member 4 is attached to a case 2, the position of the fixing member 4 attached to the case 2 can be changed along the direction L' intersecting at right angles to the longitudinal direction L. Even the same fixing member 4 can hold the electric wire 8 having different outside diameters between the case 2 and the fixing member 4.

In this embodiment, the three pairs of the lock holes 61a, 61b and 61c are provided, however, it is to be understood that two pairs of lock holes may be provided and four or more pairs of lock holes may be provided. Further, in this embodiment, the lock holes 61b and 61c are further provided in the current sensor 1 of the first embodiment, however, it is to be understood that the lock holes 61b and 61c may be further provided in the current sensor 101 of the second embodiment.

Figure 13:
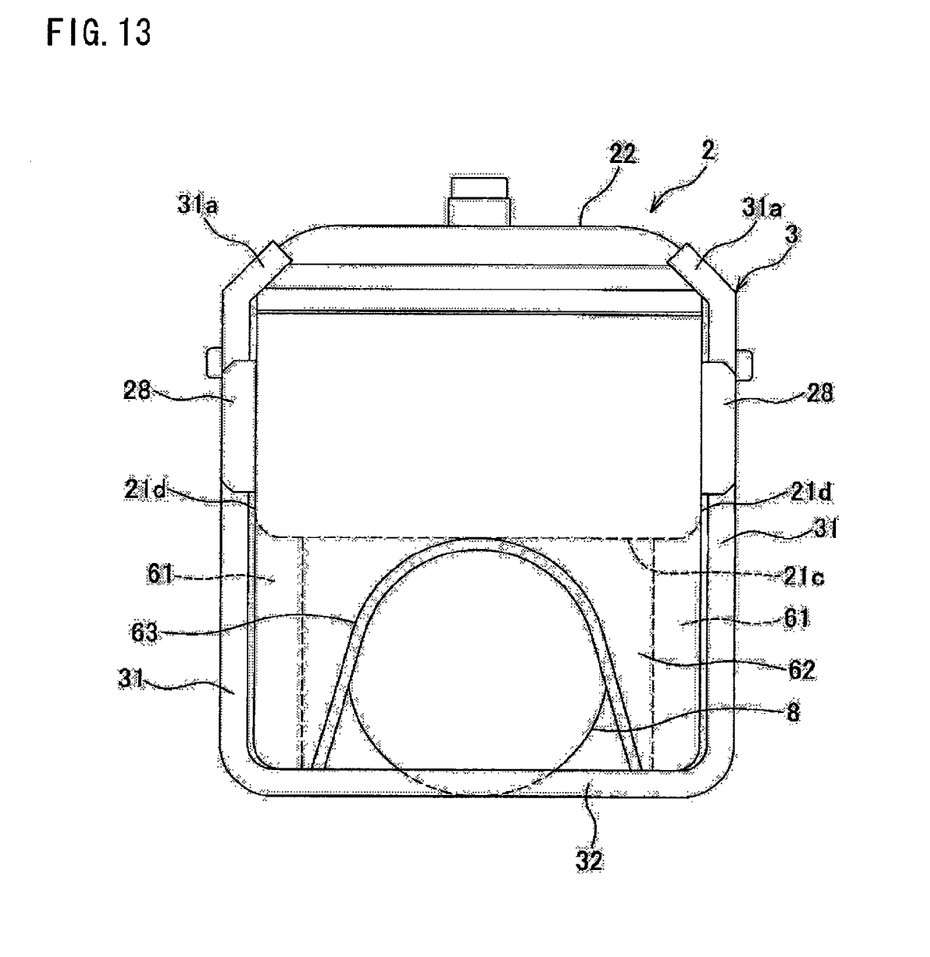
FIG. 13 is a front view showing other form of the present invention.

In the current sensors of the first to third embodiments, the fixing member 4 is provided. However, in the present invention, as shown in FIG. 13, an electric wire 8 can be sandwiched between a case (102) and a cover 3 (103) depending on the outside diameter of the electric wire 8 or the form of a cut out part 63. In that case, the fixing member 4 may not be provided.

In the first to third embodiments, the protruding parts 71 (72) are provided in the case 2 (102). However, in the present invention, protruding parts 71 (72) may be provided in a cover 3 (103).

In the first to third embodiments, the conductor is defined as the electric wire 8. However, in the present invention, a conductor may be a bus bar or the like.

Further, in the first to third embodiments, the groove part 6 is provided in the case (102). However, in the present invention, a groove part 6 may be provided in a cover 3 (103) and may be provided in both the case 2(102) and the cover 3(103).

The above-described embodiments merely show representative embodiments of the present invention and the present invention is not limited to these embodiments. Namely, various modifications can be made within a scope without departing from the spirit of the present invention.

The present application is based on Japanese Patent Application No. 2007-317053 filed on Dec. 7, 2007, the contents of which are incorporated herein for reference.

INDUSTRIAL APPLICABILITY

This invention can provide a current sensor that can be simply attached to electric wires having different outside diameters without a backlash.

The invention claimed is:

1. A current sensor for measuring a current supplied to a conductor, the current sensor comprising:
    a case which accommodates an electrical parts therein; and
    a cover that is configured to be attached to the case,
    wherein a groove part is provided on an outer surface of the case to allow the conductor to pass through the groove part, and the groove part has a substantially circular arc shape;
    wherein a fixing member is arranged between the case and the cover so that the conductor arranged on the groove part is sandwiched between the fixing member and the case;
    wherein the groove part has a pair of inclined parts which are inclined in directions where the inclined parts are separated from each other in accordance with a distance from a bottom of the groove part;
    wherein a plurality of lock protrusions are provided on an outer surface of the fixing member;
    wherein a plurality of lock holes are provided in the case, and the lock protrusions are engaged to the plurality of lock holes when the fixing member is attached to the case, and
    wherein the lock holes are arranged with intervals in a direction where the fixing member is moved to attach to the case.

2. The current sensor according to claim 1, wherein the cover is comprised of a material having a magnetic shield property.

3. The current sensor according to claim 2, wherein the cover is formed in an annular shape having a gap along an extending direction of the conductor.

4. The current sensor according to claim 1, further comprising:
    a protruding part which protrudes from one of the case and the cover to the other,
    wherein when the cover is attached to the case, the protruding part abuts on the other of the case and the cover.

5. The current sensor according to claim 1, further comprising:
    a positioning portion which positions the case and the cover relatively.

6. The current sensor according to claim 1, wherein the fixing member has a cut out part,
    wherein the groove part includes:
        a plurality of standing walls connecting both ends and central parts of a pair of side walls standing from a bottom surface of the case; and
        cut out parts provided respectively in the standing walls,
    wherein the fixing member is accommodated between the standing walls of the case to hold the conductor arranged on the groove part, and
    wherein when the cover is attached to the case, the conductor arranged on the groove parts is sandwiched between the case and the fixing member.

7. A current sensor for measuring a current supplied to a conductor, the current sensor comprising:
    a first conductor accommodating part including:
        a groove for contacting a conductor that extends in a first direction;
        a first lock element; and
        a second lock element that is above the first lock element in a second direction that is orthogonal to the first direction; and
    a second conductor accommodating part including:
        a conductor contacting surface for contacting the conductor; and
        a third lock element that is configured to separately mate with the first and second lock elements in order to lock the first and second conductor accommodating parts together and around a periphery of the conductor,
    wherein, in response to the third lock element mating with the first lock element, a distance measured along the second direction between the apex of the groove and conductor contacting surface is a first value, and in response to the third lock element mating with the second lock element, a distance measured along the second direction between the apex of the groove and conductor contacting surface is a second value, and
    wherein the first value is greater than the second value.

* * * * *